United States Patent [19]

Acket et al.

[11] 3,754,191

[45] Aug. 21, 1973

[54] SEMICONDUCTOR DEVICE FOR AMPLIFYING MICRO-WAVE

[75] Inventors: Gerard Adriaan Acket; Marinus Teunis Vlaardingerbroek, both of Emmasingel, Eindhoven, Netherlands

[73] Assignee: U.S. Philips Corporation, New York, N.Y.

[22] Filed: Aug. 21, 1972

[21] Appl. No.: 282,165

Related U.S. Application Data

[62] Division of Ser. No. 856,132, Sept. 8, 1969.

[30] Foreign Application Priority Data

Sept. 10, 1968 Netherlands .......................... 6812862

[52] U.S. Cl. .......................... 330/5, 330/39, 330/61 A

[51] Int. Cl. .......................... H03f 3/04

[58] Field of Search .......................... 330/5

[56] References Cited

UNITED STATES PATENTS 3,691,481 9/1972 Kataoka et al. .......................... 330/5

*Primary Examiner*—Roy Lake
*Assistant Examiner*—Darwin R. Hostetter
*Attorney*—Frank R. Trifari

[57] ABSTRACT

A semiconductor microwave amplifier is described with a construction to suppress the formation of travelling domains producing unwanted oscillations. In one embodiment, the device construction includes an active epitaxial layer of one conductivity type on a substrate of the oppsoite conductivity type, resulting in a p-n junction which is reversed biased during use. Contacts are provided on the active layer. Means are also provided to introduce and extract signals from the device.

4 Claims, 3 Drawing Figures

SEMICONDUCTOR DEVICE FOR AMPLIFYING MICRO-WAVE

Figure 1:
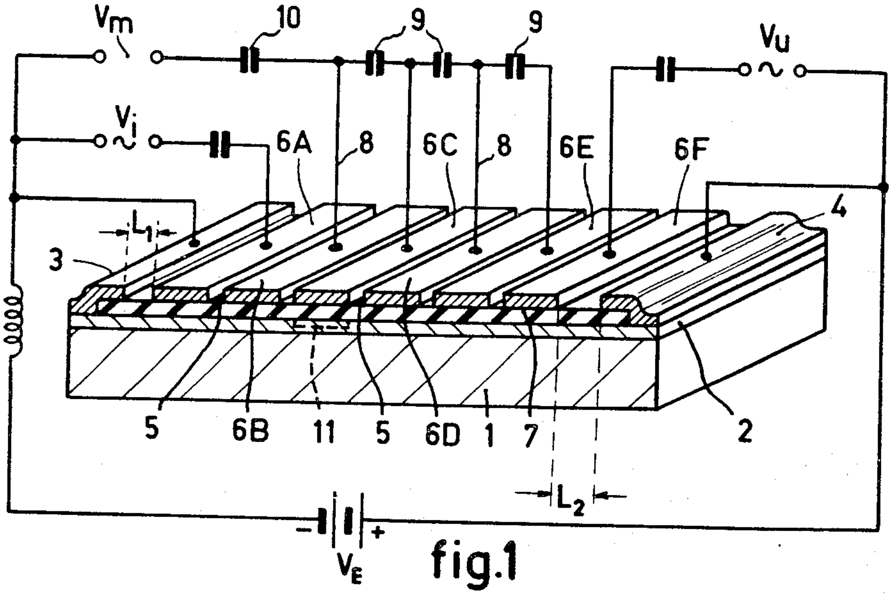

This application is a division of a copending application, Ser. No. 856,132, filed Sept. 8, 1969.

The invention relates to a semiconductor device for amplifying microwaves comprising a semiconductor layer having at least two connecting contacts, in which layer a negative differential resistance can be established when applying a sufficiently high direct voltage between the connecting contacts.

Such devices are known; they are employed for producing or amplifying electric signals of high frequency. They are based on the phenomenon that in some semiconductor materials, for example, gallium arsenide, cadmium telluride, indium phosphide and zinc selenide at a sufficiently high field strength (limit value for gallium arsenide is about 3.5 kV/cm) a transfer of electrons occurs in the conduction band from a state of lower energy and higher mobility to a state of higher energy and lower mobility. As a result a negative differential resistance occurs in a given voltage range. This negative differential resistance may be utilized for the amplification of electric signals. The required field strength is obtained by applying a sufficiently high direct voltage between two connecting contacts, the cathode contact and the anode contact, arranged on the semiconductor layer.

Under certain conditions said transition of electrons in such structures may give rise not only to a negative differential resistance but also to the formation of regions of high field strength, termed domains, which travel in the active layer from the cathode contact towards the anode contact with a speed which is approximately equal to the drift velocity of the electrons. Thus high-frequency oscillations are produced between the connecting contacts, but in devices of the kind set forth, to which the invention relates, these oscillations are undesirable and should be avoided. By calculation it can be found that this formation of domains can be avoided when the product of the concentration $n_0$ of majority charge carriers in the semiconductor layer and the distance L between the connecting contacts is lower than a given limit value. This may be accounted for as follows. When between the cathode contact and the anode contact a local difference in electron density and hence a space-charge region is produced, for example, by an input signal applied between anode and cathode, this space-charge region will move from the cathode to the anode and exhibit growth owing to the negative differential resistance produced by the voltage difference between cathode and anode in the semiconductor layer. The growth of this space-charge region has to be limited, because at an excessive growth the aforesaid domains are produced. In the known devices the electric field lines emanating from said space charge will extend practically all parallel to the field applied between the anode and the cathode and will contribute to said growth of the space charge. Therefore, the distance L between anode and cathode of the known devices is restricted to a few microns, while in addition the doping concentration $n_0$ of the layer must not be too high. If no external cause of the generation of charge carriers such as radiation is present, the value $n_0$ substantially corresponds to the doping concentation. With an epitaxial layer of n-type gallium arsenide which is frequently used in such devices, said limit value of $n_0 \times L$ is of the order of $10^{12}$ $cm^{-2}$ ($n_0$ in electrons/cc and L in cms).

In order to mitigate the restrictions to which said known devices are subjected it has been proposed to have the semiconductor layer join a boundary region of higher resistivity and preferably of a higher dielectric constant than the semiconductor layer, as described in a copending application, Ser. No. 832,280, filed June 18, 1969. Thus a comparatively large portion of the field lines emanating from the space charge will pass via the said boundary region so that in the direction of the layer the field strength component (the longitudinal field strength) which determines said growth of the space charge region, is considerably reduced, which permits of using a considerably larger distance L between the connecting contacts and/or a considerably higher doping concentration $n_0$ of the active semiconductor layer.

The invention has for its object to provide a construction in which a very effective deflection of the field lines emanating from the space charge in a direction transverse of the semiconductor layer is achieved with the aid of very simple means.

The invention is based on the recognition that by providing an electrically good-conducting layer, separated from the active semiconductor layer by a blocking layer, said deflection of the field lines can be obtained in a simple manner.

Therefore, according to the invention a semiconductor device of the kind set forth for amplifying microwaves is characterized in that at least one side of the semiconductor layer is provided with an electrically good-conducting layer which is electrically separated from the semiconductor layer by a blocking layer and has a sheet resistance lower than that of the semiconductor layer, while the connecting contacts are spaced apart from each other in the direction of the layer so that domains of high field strength cannot be formed in the semiconductor layer.

The term sheet resistance is to denote, as usual, the resisitivity of the layer divided by its thickness. This sheet resistance is expressed in Ohm/square.

Owing to the presence of the good conducting layer the field lines emanating from said space charge are deflected for a large portion in a direction transverse of the semiconductor layer and extend otherwise inside the good conducting layer so that the aforesaid advantageous effect i.e. inhibition of domain formation and the consequential increase of the maximum permissible $n_0L$ product is achieved.

The deflection of the field lines achieved in the device in accordance with the invention is particularly effective, since the resultant field distribution corresponds on approximation with that obtainable if the semiconductor layer were joined by a boundary region as mentioned above, but having an infinitely high dielectric constant.

A further important advantage of the device in accordance with the invention is that in many known devices the good conducting layer and the blocking layer can be applied substantially without additional manufacturing steps so that the device in accordance with the invention can be manufactured by a method requiring very little labour.

Although basically the semiconductor layer may be made of polycrystalline material, it will be preferred to use a single-crystal layer in view of transitional resistances frequently occurring at grain boundaries and other disturbances.

The thickness of the semiconductor layer is subjected to limits, since if the thickness of the active epitaxial layer is large as compared with the dimension of the space-charge region in the direction of the layer, a comparatively large portion of the field lines will extend inside the layer from the cathode towards the anode despite the presence of the blocking layer and the good conducting layer. It is therefore desirable, in order to inhibit as far as possible the formation of domains, for the thickness of the active epitaxial layer to be considerably smaller, preferably at least twice as small as the length of a domain measured from cathode to anode, which might be formed in the event of an unlimited layer thickness. This length of the domain depends upon various factors. It can be proved (see "Bell System Technical Journal" Vol. 46, December 1967, Nr. 10, page 2,257) that the domain length is substantially equal to:

$$\sqrt{(2V\epsilon_o\ \epsilon_r)/en_o},$$

wherein $V$ is the voltage drop in Volts across a domain, $\epsilon_r$ is the relative dielectric constant of the layer, $n_o$ is the concentration of majority charge carriers in the layer per m$^3$, $e$ is the electron charge in Coulombs and $\epsilon_o$ is the dielectric constant of the vacuum in Farad/m.

Consequently the minimum domain length occurs at the critical minimum field strength $E_c$ at which a domain can be formed in the material concerned. In practice it is found that on approximation: $V = E_cL/2$ , wherein $L$ is the (minimum) distance between the connecting contacts. The minimum domain length is therefore approximately:

$$\sqrt{(E_c \cdot L \cdot \epsilon_o\ \epsilon_r)/en_0}\ .$$

An important, preferred embodiment of the invention is characterized in that the thickness of the epitaxial layer is at the most equal to $$\tfrac{1}{2}\ \sqrt{(E_c \cdot L \cdot \epsilon_o\ \epsilon_r)/en_o},$$

wherein $E_c$ is the critical field strength in Volt/m, above which domains may be formed in the semiconductor material of the layer, L is the smallest distance in m between the connecting contacts, $\epsilon_r$ is the relative dielectric constant of the layer, $e$ is the electron charge in Coulombs, $n_o$ is the concentration of majority carriers of the layer per m$^3$ and $\epsilon_o$ is the dielectric constant of the vacuum in Farad/m. This results in an upper limit for the ratio between layer thickness and contact distance, below which the formation of domains is strongly inhibited. In connection with the aforesaid restrictive condition relative to the layer thickness, the thickness is preferably chosen to be at the most equal to 5 $\mu$m and preferably at the most equal to 1 $\mu$m so that at the usual voltage, contact dis-tance and doping the formation of domains is prevented in layer thicknesses which can otherwise be simply obtained by technological means, The blocking layer intended to protect the sub-jacent active semiconductor layer from short-circuit by the good conducting layer may be formed in various ways. In an important preferred embodiment of the invention the blocking layer is formed by an insulating layer applied to the active semiconductor layer, the good conducting layer being applied to the former. The insulating layer may be formed by any insulating material. The insulating layer is advantageously formed by silica or silicon nitride. Silicon nitride can be very effectively applied especially to gallium arsenide. An important advantage of the use of an insulating layer as a blocking layer is that in many known constructions of semiconductor devices for amplifying micro-waves an insulating layer, often a silicon-oxide layer, is provided, while the anode and cathode contacts are obtained by means of metal layers applied to the insulating layer and establishing a contact with the semiconductor layer through windows in the insulating layer. By suitably changing the masks employed for applying the insulating layer and the metal layers, the insulating layer and the good-conducting layer thereon, in this case, a layer of the same metal as the connecting contacts, can be provided in accordance with the invention without the need for additional steps. The thickness of the insulating layer may vary within wide limits, but it lies preferably between about 0.1 $\mu$ and about 1 $\mu$.

The good conducting layer is preferably formed by a metal layer which may form a Schottky barrier with the subjacent semiconductor layer. This has the advantage that if the insulating layer has defects in the form of pin holes, the metal does not establish a short-circuit with the semiconductor layer through said holes, since it is electrically separated therefrom by the Schottky barrier.

The blocking layer as a whole may be formed by a Schottky barrier. Therefore, in a further preferred embodiment the semiconductor layer is provided with a metal layer which forms a Schottky barrier serving as a blocking layer with the semiconductor layer, said barrier being biassed in the reverse direction in operation. This structure has the advantage that a separate barrier layer need not be provided.

The blocking layer may as an alternative be formed by the depletion layer of a pn-junction. In a further preferred embodiment of the invention the active semiconductor layer joins a second semiconductor layer of the opposite conductivity type, having a lower resistivity, which is electrically separated from the first layer by the depletion layer of the pn-junction formed by the two semiconductor layers and is biassed in the reverse direction in operation.

The second semiconductor layer may be made of the same semiconductor material as the first layer or of a different semiconductor material.

The active semiconductor layer may be self-supporting. In most cases, however, for reasons of increasing the rigidity, the semiconductor layer is applied to a substrate. This may be a substrate of ceramic material. In an important preferred embodiment the active semiconductor layer is applied in the form of an epitaxial layer to a semiconductor substrate of the same semiconductor material or of a different material having an appropriate lattice constant.

If a pn-junction is employed as a blocking layer, the second semiconductor layer of the opposite conductivity type, adjacent the first active semiconductor layer may form part of the substrate, which means that the second semiconductor layer may be formed by the substrate as a whole or by a surface layer of the substrate.

In all aforesaid preferred embodiments a blocking layer and a good conducting layer may be provided on both sides of the active semiconductor layer in order to amplify the deflection effect.

The good conducting layer may form a single coherent layer. However, in an important, preferred embodiment the good conducting layer is divided between the connecting contacts into partial layers by means of one or more gaps extending substantially parallel to the equipotential lines between the connecting contacts. The gaps and the facing edges of the anode and cathode contacts need not be straight. There may also be used concentric connecting contacts and annular gaps concentric thereto or other geometrical dispositions of greater complication. This subdivision of the good conducting layer into partial layers has the advantage that excessively high potential leaps across the blocking layer can be avoided, since the partial layers will be at relatively different potentials.

Said partial layers may be electrically floating in operation, while the potential of each partial layer will adapt itself to the potential to the subjacent part of the semiconductor layer.

In an important preferred embodiment the good conducting layer or at least one of the partial layers is provided with a connecting conductor. It is advantageous to connect one or more of these conductors in operation to an external potential which is substantially equal to the mean potential of the portion of the active semiconductor layer to which the partial layer concerned is applied plus the bias voltage across the blocking layer. In this way the desired potential distribution among the various partial layers is ensured.

The gap width between adjacent partial layers is preferably so small that domains cannot be formed in the active semiconductor layer between these partial layers or in other words the limit value of the aforesaid $n_oL_s$ product (wherein $L_s$ is the gap width) should not be transgressed in the gaps. This means an upper limit for $L_5$. The minimum gap width is, of course, determined by the breakdown voltage between the partial layers. In view thereof the gap width will in practice be chosen as small as possible.

The active semiconductor layer preferably consists of n-type gallium arsenide having a resistivity of about 0.1 to 10 Ohm.cm.

The active semiconductor layer may advantageously be applied to a substrate of semi-insulating gallium arsenide of a resistivity of at least 1,000 Ohm.cm so that also on the side of the substrate an additional amplification of the deflection of the field lines is obtained.

In an important preferred embodiment the good conducting layer or at least one of the partial layers is connected in operation to an external, variable potential so that the amplification of the device can be modulated. If such a potential is applied to the layer concerned that through the blocking layer a depletion layer is induced in the active semiconductor layer, the amplification of the space-charge wave passing from cathode to anode will be reduced due to the lack of electrons in the depletion region. By varying the modulation voltage the amplification can thus be modulated.

A further, very important, preferred device embodying the invention, in which the in-coupling and out-coupling of the input signal and of the output signal respectively can be carried out to the optimum extent in a simple manner, is characterized in that an input contact is provided between the cathode contact and the anode contact, while an alternating signal to be amplified is applied between the input contact and the first connecting contact. In such an embodiment comprising a separate input contact an optimum input coupling can be obtained independently of the distance between the connecting contacts. It can be calculated that an optimum input coupling is obtained when $L_1$ is approximately equal to $n\cdot(v/f)$, wherein $L_1$ is the distance in cms between the input contact and the first connecting contact, $v$ is the drift velocity in cms/sec of the majority carriers in the epitaxial layer, $f$ is the frequency of the alternating voltage to be amplified and $n$ is an integer. Quite independently of the requirements to be met by the input coupling the value of $L$, the distance between cathode and anode, may be chosen to be optimal with respect to the electric properties and the thickness of the epitaxial layer. In an embodiment in which only the two connecting contacts at a relative distance of $L$ are provided, a maximum amplification requires $L$ to be $\approx n\cdot(v/f)$, wherein $n$, $v$ and $f$ have the aforesaid meaning. See "Transactions I. E.E.E.," vol. Ed 13, January 1966, pages 4 – 21, particularly page 16, FIG. 9. Still more advantageous in this respect is a further preferred embodiment in which not only an input contact but also an output contact is provided between the connecting contacts. In this case it is possible, independently of other factors, to provide an optimum output coupling, to which it applies, as can be calculated, that the distance between the output contact and the second connecting contact should practically be equal to $(m + ½)\cdot(v/f)$, wherein $v$ and $f$ have the aforesaid meaning and $m$ is an integer. The input and output contacts may be formed by the partial layers lying at the side of the connecting contacts. When a pn-junction is used as a blocking layer, the second layer of the conductivity type opposite that of the active semiconductor layer may be provided with a connecting conductor and form a common input and output contact of the device.

Figure 2:
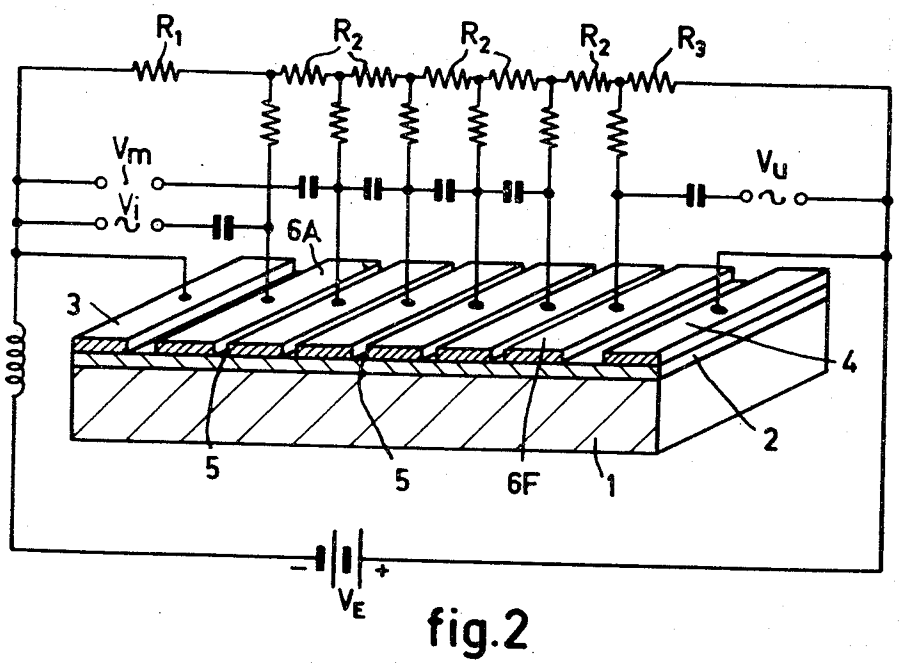
Figure 3:
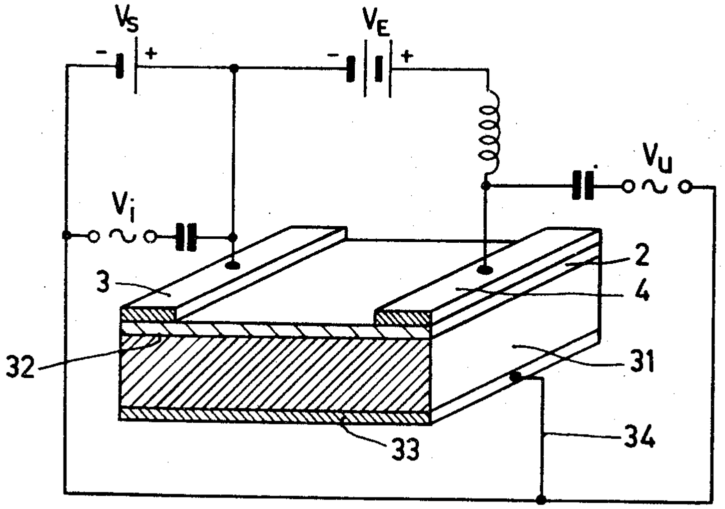

The invention will now be described more fully with reference to a few embodiments and to the drawing, in which FIG. 1 shows schematically and in perspective a device in accordance with the invention, FIG. 2 shows schematically in perspective a further device in accordance with the invention and FIG. 3 shows a third device embodying the invention.

The figures are schematical and for the sake of clarity the dimensions are not to scale. This applies particularly to the dimensions in the direction of thickness. In all Figures corresponding parts are designated by the same reference numerals.

FIG. 1 shows schematically in a perspective view a semiconductor device in accordance with the invention. The device comprises a substrate 1 of semi-insulating gallium arsenide having a resistivity of $10^4$ Ohm.cm, a thickness of 75 $\mu$, a length of 400 $\mu$ and a width of 100 $\mu$, on which an epitaxial layer 2 of n-type gallium arsenide of a resistivity of 1 Ohm.cm and a thickness of 1 $\mu$ is deposited. On said layer are deposited in the direction of the layer two connecting contacts, a cathode contact 3 and an anode contact 4, spaced apart from each other and formed by alloyed, parallel tin strips.

The distance L between the contacts 3 and 4 is 315 $\mu$.

In the layer 2 a negative differential resisrance can be adjusted between the contacts 3 and 4. For this purpose such a high direct voltage has to be applied between these contacts that the field strength in the layer exceeds a critical value of about 3.5 kV/cm. In the device concerned the critical voltage difference between cathode and anode is therefore 0.0315 × 3,500 = 110 V.

On the semiconductor layer 2 a gold layer 6 of a thickness of 1 μ is deposited, which is divided by 5 μ wide gaps 5 into the partial layers 6A to F, having the form of relatively parallel strips extending also parallel to the connecting contacts 3 and 4 and having a width of 40 μ. The partial layers 6 are electrically separated from the semiconductor layer 2 by a layer 7 of silicon nitride of a thickness of 0.5 μ. The sheet resistance of the gold layer is $2.4 \cdot 10^{-2}$ Ohm/square and is therefore considerably lower than that of the gallium arsenide layer 2, which is $10^4$ Ohm/square.

The minimum domain dimensions from the cathode towards the anode is, as stated above, given on an approximation by the formula:

$$\sqrt{(E_c \cdot L \cdot \epsilon_o \cdot \epsilon_r)/en_o}$$

for the layer 2 of n-type gallium arsenide of a resistivity of 1 Ohm.cm wherein $$E_c = 3.5 \cdot 10^5 \text{ V m}^{-1}$$

$$L = 3.15 \cdot 10^{-4} \text{ m}$$

$$\epsilon_o = 8.854 .10^{-12} \text{ Fm}^{-1}$$

$$\epsilon_r = 13.5$$

$$e = 1.6 \cdot 10^{-9} \text{ C}$$

$$n_0 = 10^{21} \text{ m}^{-3}$$

This results in a minimum domain length of 11.4 μ. The layer 2 in this example has therefore a thickness which is smaller than half this minimim domain length so that the formation of a domain is strongly inhibited. As a consequence it is possible to use the comparatively large cathode-anode distance of 315 μ without the risk of the formation of a domain.

The gold layer 6 is capable of forming a Schottky barrier with n-type gallium arsenide. If the nitride layer 7 should exhibit holes, the gold layer will not give rise to a short-circuit with the gallium arsenide and remain electrically separated therefrom by a Schottky junction.

The gaps 5 extend substantially parallel to equipotential lines which are formed in this structure by lines parallel to each other and to the anode and cathode contacts 3 and 4, when a direct voltage is applied between the contacts 3 and 4.

The partial layers 6A to F are all provided with connecting conductors 8 (see FIG. 1). The layers 6B to E are capacitatively connected 10 to an external, variable modulation voltage source $V_m$, while they are relatively connected capacitatively by the capacitors 9. Between the cathode contact 3 and the nearest partial layer 6A an input signal $V_i$ can be applied capacitatively, whereas between the anode contact 4 and the nearest partial layer 6F an output signal $V_u$ can be derived capacitatively, see FIG. 1.

In operation a direct votlage $V_E$ (see FIG. 1) of 160 V is applied between the contacts 3 and 4 in series with a choke. Thus a field strength of 5 kV/cm is produced in the layer 2 between the cathode 3 and the anode 4 so that the work point of the device is adjusted in the range of differential negative resistance. An input alternating voltage $V_i$ is applied between the contacts 3 and 6A. The resultant space-charge wave passes through the layer 2 in the direction from the cathode towards the anode and is amplified owing to the negative differential resistance, so that an amplified output signal $V_u$ of the same frequency can be derived between the contacts 6F and 4.

The distance $L_1$ between the cathode contact 3 and the partial layer 6A is 20 μ, while the distance $L_2$ between the partial layer 6F and the anode contact 4 is 30 μ. The frequency of the signals $V_i$ and $V_u$ is 5 GHz ($5.10^9$ sec$^{-1}$). Since the drift velocity $v$ of the electrons in the layer 2 is about $10^7$ cm/sec with the field strength applied, it applies to the frequency $f$ of the signals $V_i$ and $V_u$ approximately that $f = v/L_1 = (3/2)(v/L_2)$, so that an optimum coupling and output coupling are obtained.

Since the layer 6 is divided into partial layers, such a high voltage across the nitride layer 7 as is likely to give rise to breakdown is avoided. The potential of each of the partial layers will match that of the subjacent portion of the semiconductor layer 2.

The modulation voltage $V_m$ is applied through the capacitances 9 and 10 to the partial layers 6B to E, for example, in the form of voltage pulses negative to the cathode. They produce in the layer 2 depletion regions, one of which (11) is illustrated in the figure by broken lines. The total quantity of charge carriers and hence the amplification in the layer 2 is thus locally reduced temporarily.

The formation of domains of high field strength in the layer 2 is inhibited not only by the presence of the layers 6 and 7 but also by the presence of the high-ohmic substrate 1. Also for this reason the interstices between the metal layers 3 and 6A and 4 and 6F respectively may be fairly large for obtaining optimum input and output couplings.

The device shown in FIG. 1 can be manufactured as follows: The basic material is a wafer of semi-insulating gallium arsenide of a resistivity of $10^4$ Ohm.cm. One surface thereof is polished and etched in order to obtain a surface having a minimum of crystal defects. A layer 2 of n-type gallium arsenide is deposited on the resultant surface from the vapour phase epitaxially. This is carried out at about 750° C by the reaction between gallium and arsenic, the gallium being obtained by the decomposition of gallium monochloride and the arsenic by the reduction of arsenic trichloride with hydrogen. Simultaneously with the growth of the gallium arsenide a donor, for example, silicon, tellurium, tin or selenium is deposited in such a quantity that an epitaxial layer 2 having a uniform donor concentration of about $10^{15}$ at/cc is formed, which corresponds to a resistivity of about 1 Ohm.cm. The growth is continued until a layer of a thickness of 1 μ is obtained.

on the epitaxial GaAs layer 2 is then deposited a silicon nitride layer 7 of a thickness of 0.5 μ. This may be carried out very effectively by the decomposition of hydrazine and silane under the action of ultraviolet light, while the gallium arsenide is held at a temperature of about 400° C during the deposition of the nitride layer. The nitride layer is then removed at the edges of the wafer by conventional photo-etching techniques, phosphoric acid being used as an etchant in order to partially expose the layer 2. Then tin strips 3 and 4 are applied to the exposed edges of the active layer 2 and partially to the nitride layer, said strips being alloyed at a temperature of 650° C in a hydrogen atmosphere. Thus ohmic contacts are formed on the layer 2.

Then a gold layer 6 of a thickness of 1 $\mu$ is applied to the surface by vapour-deposition, after which the partial layers 6A to F are formed by using conventional photo-masking and etching techniques. Connecting conductors are then fastened to said partial layers and to the tin strips 3 and 4, after which the assembly is arranged in a suitable envelope.

Instead of the silicon nitride layer 7 it is also advantageous to apply a silica layer. Instead of a gold layer, the same metal may be used for the layer 6 as for the contacts 3 and 4, if the advantage of Schottky insulation for the event of defects in the layer 7 is abandoned in which case the layers 3, 4 and 6 may be applied simultaneously.

Instead of the layers 6A and 6F, also the contacts 3 and 4 may serve as input and output contacts. Then an input signal may be applied through, for example, a coaxial cable between the contacts 3 and 4, which signal can be derived through the contacts 3 and 4 and the same coaxial cable in the form of a reflected, amplified signal. In order to obtain an advantageous input coupling, it is preferred, as stated above, to use a signal frequency equal to $V/L$ or a multiple thereof. The drift velocity $v$ is then about $10^7$ cm/sec, the contact distance $L$ is 315 $\mu = 3.15 \cdot 10^{-2}$ cm and the optimum frequency is $10^9/3.15 = 0.32$ GHz or a multiple thereof.

FIG. 2 illustrates schematically in a perspective view a different device in accordance with the invention. The structure of this device is similar to that of FIG. 1, the difference being, however, that the insulating layer 7 is replaced by a blocking layer formed by the Schottky junction between the gold layer 6 (divided into partial layers 6A to F) and the subjacent gallium arsenide layer 2. Otherwise the dimensions and materials of this device are like those of the preceding device, as well as the voltages applied in operation and the frequencies of the input and output signals $V_i$ and $V_u$.

The connecting conductors of the partial layers 6A to F are connected to a voltage divider formed by resistors $R_1$, $R_2$, $R_3$ and proportioned so that the layers 6A to F are at an external potential substantially equal to the mean potential of the part of the semiconductor layer 2 on which the partial layer concerned is deposited plus the negative voltage of a few volts in orde to bias the Schottky junction in the reverse direction. The voltage drop across the Schottky junction is thus restricted beneath each partial layer to a value at which breakdown cannot occur. In this connection it should be noted that the number of partial layers is chosen not to exceed 6 in the figures for the sake of clarity. It will be obvious that if at the required voltage between anode and cathode the voltage across the blocking layer should become too high, the number of partial layers has to be accordingly higher.

The deivce shown in FIG. 2 may be manufactured in completely the same manner as that shown in FIG. 1, the difference being that there is not grown an insulating layer on the semiconductor layer 2 and that the gold layer 6 is directly vapour-deposited on the active semiconductor layer 2.

The device shown schematically in a perspective view in FIG. 3, like the devices of FIGS. 1 and 2, comprises an n-type gallium arsenide layer 2 of a resistivity of 1 Ohm.cm having a cathode contact 3 and an anode contact 4, but otherwise it is constructed in a slightly differing manner. The substrate is formed here by a layer 31 of p-type gallium arsenide having a doping of about $10^{18}$ at/cm$^{-3}$ (resistivity 0.001 Ohm.cm). The good conducting substrate 31 is electrically separated from the gallium arsenide layer 2 by the depletion layer of the pn-junction 32 (see FIG. 3) formed between the substrate 31 and the layer 2, which junction is biassed in the reverse direction in operation.

The substrate 31 has a length of 150 $\mu$, a width of 100 $\mu$ and a thickness of 75 $\mu$. The distance between the cathode contact 3 and the anode contact 4 is 100 $\mu$. The substrate 31 has an alloyed tin layer 33 (see FIG. 3) containing a low percentage of zinc and forming an ohmic contact with the substrate.

In operation a direct voltage of 50 V is applied through a choke between the contacts 3 and 4 so that the field strength in the layer 2 is again 5 kV/cm. The substrate is brought via the contact 33 by the voltage source $V_s$ at a negative voltage of 2 V relative to the cathode 3. Thus in operation the pn-junction 32 is everywhere biassed in the reverse direction.

In this example the substrate 31 provided with contact 33 and the connecting conductors 34 forms a common input and output contact of the device. A signal voltage $V_i$ is capacitatively applied between the substrate 31 and the cathode contact 3, whereas an amplified signal $V_u$ is derived between the substrate and the anode contact 4.

The device shown in FIG. 3 may be manufactured by using the same techniques used in the manufacture of the deivces of FIGS. 1 and 2, the layer 2 being now grown on a low-ohmic substrate of the opposite conductivity type, while apart from the contacts 3 and 4 a tin layer 33 is alloyed also on the bottom side of the substrate 31.

It should be noted that in the last-mentioned embodiment instead of the substrate 31, which consists completely of low-ohmic p-type material, a substrate of a different material but with a surface layer of low-ohmic p-type material may be employed, on which the layer 2 is grown. Moreover, the material on which the layer 2 is grown and the material of the layer 2 itself may be different in composition. In the device shown in FIG. 3 a separate input contact and an output contact may be provided between the contacts 3 and 4 instead of the common contact 33 on the substrate as employed in this example. Finally a modulation voltage may be applied via the substrate 31 to the pn-junction 32 for varying the thickness of the depletion layer in the layer 2 in a manner similar to that of the depletion layer 11 in FIG. 1.

Obviously the invention is not restricted to the embodiments shown herein and within the scope of the invention many variants are possible to those skilled in the art. Particularly, other materials may be used for the layer 2, for example, CdTe, InP or ZnSe. The structures need not be rectangular. Structures having concentric anode and cathode contacts may be used, a non-linear potential distribution being then obtained between these contacts. The gaps dividing the metal layers 6 of FIGS. 1 and 2 into partial layers will then always be chosen so that they extend substantially along equipotential lines. It should furthermore be noted that the active semiconductor layer as the case may be in self-supporting state, may be provided on both sides with a blocking layer and a good conducting layer instead of being provided herewith only one side. The measure in accordance with the invention may furthermore be carried out advantageously in any possible combination with a previously suggested boundary region of high resistivity and/or high dielectric constant as indicated in FIGS. 1 and 2.

What is claimed is:

1. A semiconductor device for amplifying microwave sig-nals comprising a monocrystalline active first layer portion of semiconductor material of one conductivity type exhibiting a nega-tive differential resistance above a threshold field strength, first and second contacts to the semiconductor layer portion and spaced apart by a distance L in the longitudinal direction of the layer for applying a direct voltage of such magnitude as to produce the said negative differential resistance in the active layer portion between the contacts tending to establish undesired travelling domains of high field strength within the active layer portion; and means for suppressing said undesired travelling domains, said domain suppressing means comprising a substrate for said active layer portion, said substrate comprising a second semiconductor layer of a conductivity type opposite to that of the active layer and having a lower resistivity and electrically separated from the active first layer by a depletion layer extending from a p-n junction formed between the first and second layers, and means connected to the second and first layers for biasing the said p-n junction in the reverse direction.

2. A semiconductor amplifying device as claimed in claim 1 wherein the semiconductor first active layer is an epitaxial layer applied to a substrate comprising the second semiconductor layer.

3. A semiconductor device for amplifying microwave signals as set forth in claim 1 wherein means are provided for coupling input and output signals to the active layer.

4. A semiconductor device for amplifying microwave signals as set forth in claim 3 wherein means are provided for connecting said second semiconductor layer common to the input and output of the device.

* * * * *